United States Patent
Dadgar et al.

(10) Patent No.: US 11,870,220 B2
(45) Date of Patent: *Jan. 9, 2024

(54) SEMICONDUCTOR LAYER STACK AND METHOD FOR PRODUCING SAME

(71) Applicants: OTTO-VON-GUERICKE-UNIVERSITAET MAGDEBURG, Magdeburg (DE); AZUR SPACE SOLAR POWER GMBH, Berlin (DE)

(72) Inventors: Armin Dadgar, Berlin (DE); André Strittmatter, Magdeburg (DE)

(73) Assignees: Otto-von-Guericke-Universitaet Magdeburg, Magdeburg (DE); AZUR SPACE Solar Power GmbH, Heilbronn (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/868,447

(22) Filed: Jul. 19, 2022

(65) Prior Publication Data
US 2022/0368110 A1  Nov. 17, 2022

Related U.S. Application Data

(60) Division of application No. 17/135,896, filed on Dec. 28, 2020, now Pat. No. 11,424,596, which is a (Continued)

(30) Foreign Application Priority Data
Jun. 25, 2018  (DE) .................... 10 2018 115 222.1

(51) Int. Cl.
*H01S 5/00* (2006.01)
*H01S 5/30* (2006.01)
*H01S 5/22* (2006.01)

(52) U.S. Cl.
CPC .......... *H01S 5/3068* (2013.01); *H01S 5/2227* (2013.01); *H01S 5/3063* (2013.01); *H01S 5/3077* (2013.01); *H01S 5/3054* (2013.01)

(58) Field of Classification Search
CPC .... H01S 5/3068; H01S 5/2227; H01S 5/3063; H01S 5/3077; H01S 5/3054
See application file for complete search history.

(56) References Cited

U.S. PATENT DOCUMENTS

| | | | | |
|---|---|---|---|---|
| 4,737,960 A | * | 4/1988 | Tsang | ........................ H01S 5/30 372/45.01 |
| 4,764,439 A | * | 8/1988 | Gibbons | ............. H01M 14/005 429/111 |

(Continued)

FOREIGN PATENT DOCUMENTS

CN  104617160 A  5/2015

OTHER PUBLICATIONS

Shibata, Daisuke et al: "GaN-based Multi-junction Diode with Low Reverse Leakage Current using P-type Barrier Controlling Layer", IEDM 2011, pp. 587-590.

(Continued)

*Primary Examiner* — Kinam Park
(74) *Attorney, Agent, or Firm* — Muncy, Geissler, Olds & Lowe, P.C.

(57) ABSTRACT

A semiconductor layer stack, a component made therefrom, a component module, and a production method is provided. The semiconductor layer stack has at least two layers (A, B), which, as individual layers, each have an energy position of the Fermi level in the semiconductor band gap, (Continued)

$$E_F - E_V < \frac{E_G}{2}$$

applying to the layer (A) and $$E_L - E_F < \frac{E_G}{2}$$

applying to the layer (B), with $E_F$ the energy position of the Fermi level, $E_V$ the energy position of the valence band, $E_L$ the energy position of a conduction band and $E_L$–$E_V$ the energy difference of the semiconductor band gap $E_G$, the thickness of the layers (A, B) being selected in such a way that a continuous space charge zone region over the layers (A, B) results.

15 Claims, 6 Drawing Sheets

Related U.S. Application Data continuation of application No. PCT/DE2019/100572, filed on Jun. 20, 2019.

(56) References Cited

U.S. PATENT DOCUMENTS

| | | | | |
|---|---|---|---|---|
| 4,964,134 | A * | 10/1990 | Westbrook | H01S 5/11 372/45.01 |
| 11,424,596 | B2 * | 8/2022 | Dadgar | H01S 5/2227 |
| 2003/0080331 | A1 * | 5/2003 | Ono | H01L 27/0605 257/14 |
| 2005/0056864 | A1 * | 3/2005 | Pan | H01S 5/0422 257/202 |
| 2011/0235665 | A1 * | 9/2011 | Simon | H01L 21/0251 257/191 |
| 2013/0000727 | A1 * | 1/2013 | Iwata | H01L 31/028 438/57 |
| 2016/0118524 | A1 * | 4/2016 | Guter | H01L 31/1844 136/255 |
| 2017/0170354 | A1 * | 6/2017 | Ebel | H01L 31/03046 |
| 2017/0186904 | A1 * | 6/2017 | Guter | H01L 31/06875 |

OTHER PUBLICATIONS

Ishida, Hidetoshi et al: "Unlimited High Breakdown Voltagte by Natural Super Junction of Polarized Semiconductor", IEEE Electron Device Letters, vol. 29, No. 10, Oct. 2008, pp. 1087-1089.

Wolf, Thomas et al: "Fe and Ti doping of InP grown by metalorganic chemical-vapor deposition for the fabrication of thermally stable high-resistivity layers", Journal of Applied Physics, vol. 75, 1994, No. 8, pp. 3870-3881, ISSN 0021-8979 (P), 1089-7550 (E), DOI: 10.1063/1.356067, URL: http://aip.scitation.org/doi/pdf/10.1063/1.356067?class=pdf.

Kuijk, M. et al: "Depleted double-heterojunction optical thyristor", Appl. Phys. Lett, vol. 64, No. 16, Apr. 18, 1994, pp. 2073-2075.

International Search Report dated Dec. 4, 2019 in corresponding application PCT/DE2019/100572.

* cited by examiner

SEMICONDUCTOR LAYER STACK AND
METHOD FOR PRODUCING SAME

This nonprovisional application is a division of U.S. application Ser. No. 17/135,896, filed on Dec. 28, 2020, which is a continuation of International Application No. PCT/DE2019/100572, which was filed on Jun. 20, 2019, and which claims priority to German Patent Application No. 10 2018 115 222.1, which was filed in Germany on Jun. 25, 2018, and which are all herein incorporated by reference.

BACKGROUND OF THE INVENTION

Field of the Invention

The present invention relates to a semiconductor layer stack and a method for producing same.

Description of the Background Art

Insulating semiconductor layers are irreplaceable for electrical insulation and a low high-frequency attenuation of semiconductor device structures. In most cases, a so-called deep impurity, i.e. an impurity that is ionized «50%, i.e. ionized only to a small degree at operating temperature, is used. If there is intrinsic electron conduction in the semiconductor or impurities, doping is usually carried out with a deep acceptor and vice versa, in the case of intrinsic hole conduction, with a deep donor. Since electron injection into the insulating layer is well blocked in the first case and hole injection in the second, through a combined simultaneous doping of deep acceptors and donors such as the deep acceptor Fe and the deep donor Ti in InP, the insulation behavior is improved [T. Wolf, T. Zinke, A. Krost, H. Scheffler, H. Ullrich, P. Harde and D. Bimberg, J. Appl. Phys. 75, 3870 (1994)]. Typically, however, doping occurs with only one dopant since in most cases this is sufficient for the insulating effect and is also more easily controllable in terms of process technology. Ideally, a deep impurity occurs near the middle of the energy gap of the semiconductor and at a concentration such that it can capture all of the free charge carriers and hence, the Fermi level comes to rest, i.e. is pinned, at the energy position of the impurity, even under charge carrier injection. In the ideal case, the free charge carrier concentration of the electrons n and holes p corresponds to the intrinsic charge carrier concentration $n_i$, i.e. $n=p=n_i$.

For many semiconductors, including those with large energy gaps such as the Group III nitrides, there are in principle many dopants which form deep impurities and allow for highly resistive materials, but they are often not located near the center of the semiconductor band gap. Therefore, with sufficient concentration N of the compensating deep impurity N>n, p, i.e. at a concentration above the electron or hole concentration n or p existing without compensator, despite a Fermi level pinned thereto, residual conductivity remains available and n and p lie far above the intrinsic charge carrier concentration $n_i$. Even with charge carrier concentrations below $10^{10}$ cm$^{-3}$, this is considered to be high in some semiconductors, as for example in semiconductors such as GaN, very high breakdown field strengths of more than 3 MV/cm are possible, and in high applied voltages and field strengths, leakage currents are disadvantageous. This is partly because the power, which is converted locally at high voltages even with low leakage currents, can lead to heating and ultimately thermal breakdown. Therefore, it is desirable to have low residual conductivities or charge carrier concentrations which come as close as possible to the intrinsic charge carrier concentration. In GaN, for example, the carbon acceptor is approx. 0.9 eV above the valence band, while the iron acceptor, which can be used as an alternative, is approx. 0.6 eV below the conduction band. With a band gap of the GaN of approx. 3.4 eV at room temperature, however, the ideal position of a deep impurity is approx. 1.7 eV. Therefore, for GaN:C, there is a free holes concentration of about $1\times10^6$ cm$^{-3}$ and for GaN:Fe, a free electron concentration of about $3\times10^6$ cm$^{-3}$, well above the intrinsic charge carrier concentration of approximately $10^{-9}$ cm$^{-3}$. As a result, the sheet resistance when using these dopants is more than 10 orders of magnitude below the theoretically achievable value that an ideal dopant with an energy position close to the center of the band gap could achieve. Since such a dopant, e.g. in GaN, is so far not known or is not available in a form suitable for manufacturing the layer, these layers are limited in terms of their power capability and limit the area of use of the components produced therefrom.

SUMMARY OF THE INVENTION

It is therefore an object of the present invention to achieve improved layer insulation.

A semiconductor layer stack is proposed, characterized by at least two layers (A, B), which, as individual layers, each have an energy position of the Fermi level (103) in the semiconductor band gap (104, 105), $$E_F - E_V < \frac{E_G}{2}$$

applying to layer (A) and $$E_L - E_F < \frac{E_G}{2}$$

applying to layer (B), $E_F$ the energy position of the Fermi level (103), $E_V$ the energy position of a valence band (102), $E_L$ the energy position of a conduction band (101) and $E_L-E_V$ the energy difference of the semiconductor band gap $E_G$ (104,105), the thickness (106, 107) of the layers (A, B) being selected such that a continuous space charge zone region (110) over the layers (A, B) results. The layers may follow each other directly or be separated by other layers.

According to the invention, the object of positioning the Fermi level near the center of the energy gap of the semiconductor is achieved.

A continuous space charge zone region is achieved when an electrical field drops in the entire area or sections with different electrical potentials adjoin one another without interruption. The width of such a space charge zone between two layers depends above all on how highly doped they are, i.e. how many ionizable acceptors and donors they contain, the built-in potential difference $\psi_{bi}$, corresponding to the difference in the Fermi levels in the individual layers, and the value of the dielectric constant $\varepsilon_S$. This width can be calculated. An estimate of the space charge zone width in the p-region $W_p$ and in the n-region $W_n$ for a p-n junction with a concentration of shallow acceptors $N_A$ and shallow donors $N_D$ results in $$W_p + W_n = \sqrt{\frac{2 \cdot \varepsilon_S}{q}\left(\frac{N_A + N_D}{N_A \cdot N_D}\right)\Psi_{bi}},$$

with q being the elementary charge.

For deep impurities and multiple dopants or defects that among other things are responsible for the residual conductivity, the calculation is a bit more complex. In principle, however, the value of the space charge zone width can be easily estimated from the difference in the Fermi level positions and the concentration of ionized acceptors and donors in the space charge zone, which can be estimated from the energy position of the same. Values far beyond the thickness of the individual layers are sought in order to achieve on average a Fermi level position between the starting dopants. The dopants can, depending on the conductivity of the starting material, be acceptors or donors. Alternatively, in the case of undoped n-conducting material, a deep acceptor can also be doped in a first layer at a concentration above the electron concentration, and an acceptor and a deep donor at a higher concentration in the second layer.

Each layer, considered individually, is then depleted of charge carriers, but has Fermi level positions close to that of the deep acceptors or donors, which in the rarest cases is near the middle of the band gap. Thus, a relatively high residual conductivity remains for the individual layers.

The alternating growth of such layers, however, creates a space charge zone region which enables a Fermi level position between that of the individual impurity levels and thus a lower concentration of charge carriers in the overall layer.

In principle, the incorporation of impurities and thus the position of the Fermi level can be controlled to a limited extent by the manufacturing conditions. For targeted doping, it is ideal to use dopants that are supplied during growth either from the starting materials (intrinsic) or via a special source (extrinsic).

A particularly advantageous example provides an extrinsic or intrinsic doping resulting in at least two impurity levels, each of which having an energy position, $$E_F - E_V < \frac{E_G}{2}$$

applying to a layer (A) and $$E_L - E_F < \frac{E_G}{2}$$

applying to another layer (B) at a concentration, that the Fermi level at such infinitely thick individual layers occupies the same energy position as the impurity levels with a tolerance of ±50 meV, wherein the thicknesses of the layers in the semiconductor layer stacks are chosen such that a continuous space charge zone region (110) forms over the entire layer stack.

It is in particular advantageous to not only grow two layers on one another but to alternate this, wherein additional layers with other dopants or conductivities can be incorporated into the layer stack as long as a space charge zone region extends over the entire stack. Typically, a space charge zone region is present within a component structure even when using only one deep impurity serving as a compensator. In this case, however, the Fermi level is pinned to its energy position, which can be unfavorable. As a result of the alternating layers and the resulting, changing Fermi level position, when looking at the individual layers, a potential fluctuation and thus a space charge zone and an electric field also develop between the individual layers. On average, this enables the charge carrier concentration to be reduced further and to thus obtain values closer to $n_i$, which implies a higher sheet resistance. As a result, the concentration of the dopants used can in turn be reduced, which can have a positive effect on the switching behavior of the component layers lying above.

The doping achieves an effective Fermi energy position, which, in addition to the Fermi energy position in the individual layers, depends on the concentration of the dopant and on the thickness of the individual layers, wherein the resulting position can best be set using the thickness parameter.

In the semiconductor layer stack, preferred is an energy position of the deep impurity levels generated by the doping, $$E_F - E_V < \frac{E_G \cdot 0.8}{2}$$

applying to layer (A) and $$E_L - E_F < \frac{E_G \cdot 0.8}{2}$$

applying to layer (B), i.e. an average Fermi energy position is preferred to be in a region below or above the center region of the band gap energy, this middle range being 40% of the band gap energy. In many semiconductors, with the impurities available as individual dopants, this value lies above 50%, which would lead to an unsatisfactory compensation, as is true for GaN:Fe. If the energy level generated near the band gap energy center, i.e. within the above-defined 40% range, a satisfactory result in terms of layer insulation is usually also achieved with such a single dopant.

The method according to the invention, however, can further improve this and can therefore be suitably used in individual cases. As dopant, and here especially as an intrinsic dopant, the background doping of the layer caused by intrinsic defects or accidental contamination also applies. This can be used in an individual layer alternating with a deliberately doped layer. Due to the normally slightly fluctuating background doping of semiconductor layers, however, it is always preferable to use a deliberately doped layer. An intrinsic dopant can, e.g., be carbon or oxygen, which can come from the starting materials or carrier gases, depending on the manufacturing process. Of these dopants, in particular carbon from the alkyl radicals of the organometallic agents used, can be incorporated reproducibly with organometallic gas phase epitaxy (MOVPE) by suitable choice of the growth parameters.

Because limiting factors such as defects and in particular displacement of breakdown strength and sheet resistance, as in GaN treated here by way of example, still set a relatively low threshold, a sufficiently central position of the Fermi level due to deep-level impurities at some distance from the theoretically best position is also advisable.

In the semiconductor layer stack, an average Fermi energy position $E_F$ (108) in an energy range $$\frac{E_G}{2} - E_G \cdot 0.2 < E_F < \frac{E_G}{2} + E_G \cdot 0.2$$

is desirable in the space charge zone region (110), i.e. an average Fermi energy position in an area lower or above the average energy of the band gap, which is in each case up to 20% of the band gap energy. For purposes of simplicity, the energy band gap center is defined as an ideal Fermi level position of a semi-insulating semiconductor with $n=p=n_i$. The center position means that the Fermi level is averaged over the thickness of the buffer according to the invention in this region, i.e. that it may also lie above or below in some regions, as can be the case in an inventive, alternating doping. Ensuring that the Fermi energy in this region is ideally always optimized by selecting a sufficiently thin layer, one with an individual layer of the layer stack doped with a dopant. Thin to the extent that preferably less than ¼ of the potential change in the valence or conduction band energy that is possible for infinitely extended layer pairs should drop through the space charge zone in a layer pair.

In principle, the simultaneous doping with two dopants in one layer can also deliver the inventive benefits, but very precise control of the individual concentration is necessary in order to ideally place the Fermi level. If, however, these are individual, alternately doped layers, then the effect is used that between the two doped regions, a space charge region with slightly curved bands is formed, and that this does not very sensitively depend on the respective dopant concentrations as long as the Fermi level in the individual layers is pinned to the impurity levels induced by the dopants. In this case, the band profile can also be calculated and reproducibly manufactured.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
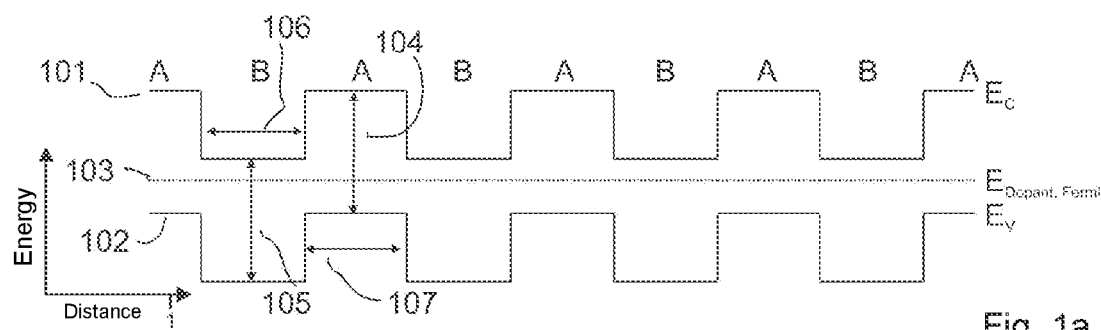
FIGS. 1*a* to 1*d* show schematic views of an energy-location-diagram.
Figure 1B:
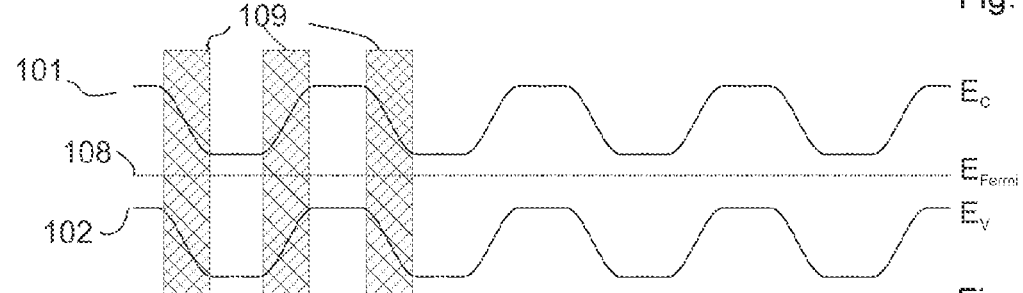
Figure 1C:
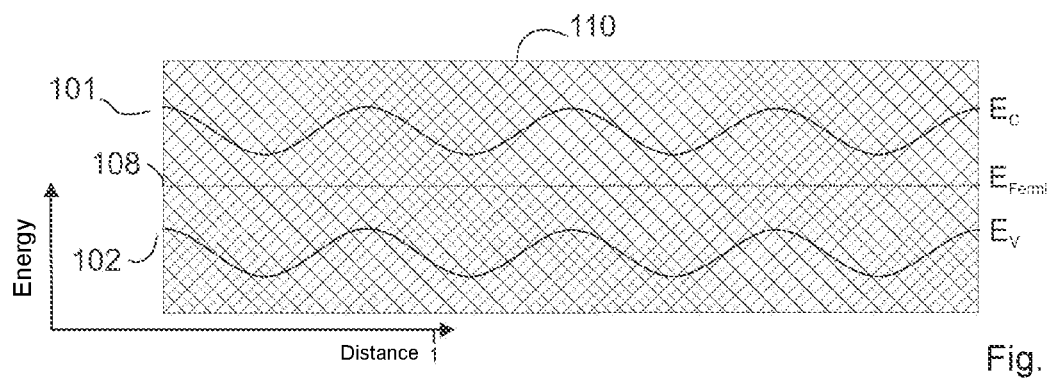
Figure 1D:
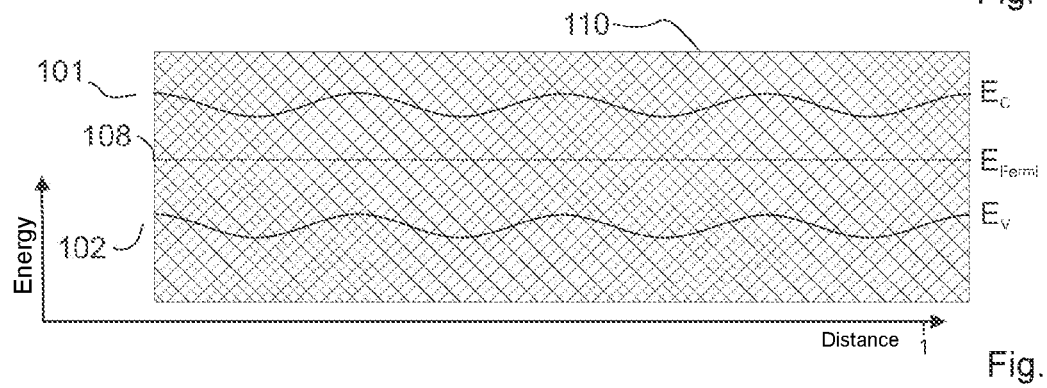

Because of the low charge carrier concentration present in the compensation of the excess charge carriers, the space charge zone generally extends over a range of several micrometers and thus results in a virtually shallow band profile with a slight modulation of the energy of the respective bands in each of the areas as shown in FIG. 1*d* or even less if the differently doped layers are chosen thin enough.

Figure 6A:
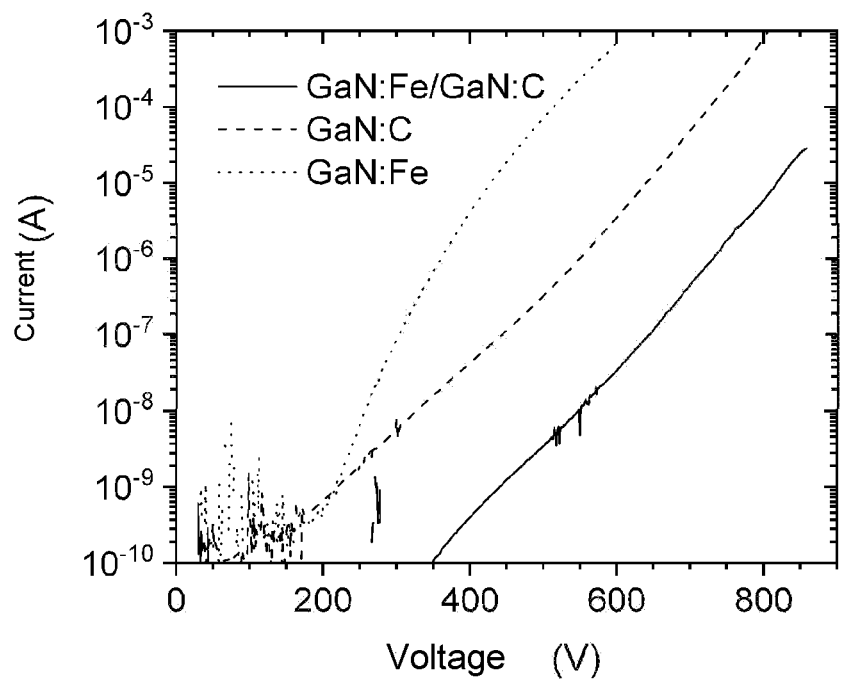
FIGS. 6*a* and 6*b* show the comparison of current-voltage characteristic curves.
Figure 6B:
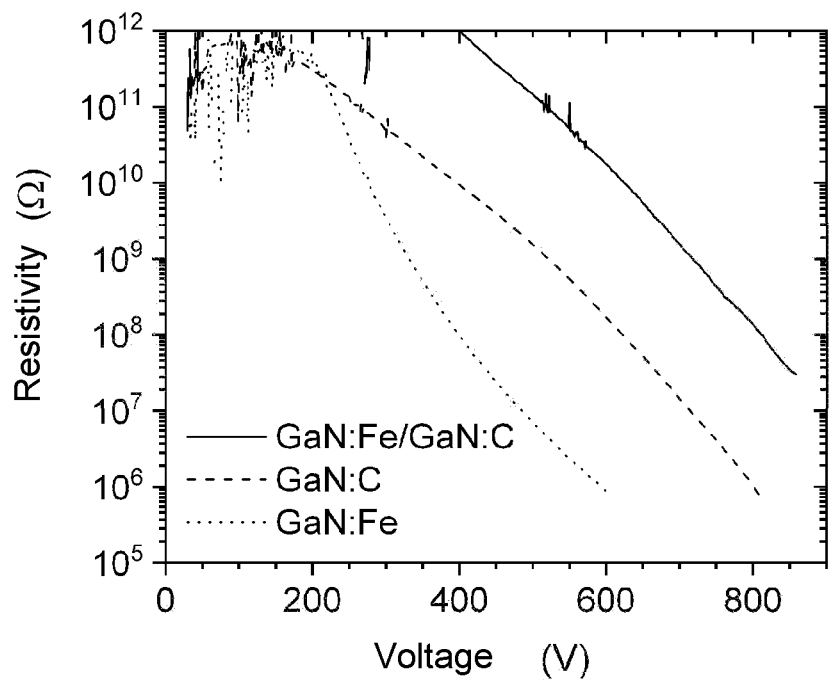

Ideal layer thicknesses are dependent on the intrinsic background doping, the type of impurity, i.e. whether acceptor or donor, and the energy position. In individual cases, the optimal doping must be simulated or found experimentally. In principle, in a semiconductor having n-type background doping, the charge carriers are already captured for the most part by an acceptor seated in the upper half of the energy gap. The charge carriers that then remain in the conduction band are captured by a second acceptor in the lower half of the band gap. The resulting space charge zone is then so wide that in almost the entire layer stack, the Fermi level is close to the lower acceptor and therefore this layer has to be rather thin so as not to lower the Fermi level too much and on average to achieve a position of the Fermi level close to the middle of the band gap, so as not to induce any noteworthy hole conduction. But even without choosing the optimum thickness, as shown in FIG. 6, improvement in the layer insulation can be achieved since the strong depletion of charge carriers is presumably achieved locally. In addition, even without applied voltage at the layer stack, the position of the Fermi level also depends on how the adjacent layers are doped.

For example, if a low, i.e. in the range of about $10^{16}$-$10^{17}$ cm$^{-3}$, but selective n-type doping by a shallow donor is chosen and said doping is to be compensated with a deep acceptor in the lower half of the band gap, it is advantageous to dope with a high concentration of the deep acceptor, well above the electron concentration, but only in thin layers. This results in a semiconductor that is completely depleted of electrons and has only a low concentration of holes due to the thin layers with the deep acceptor, in contrast to a layer doped only with the deep acceptor. These thin layers that are highly doped with a deep acceptor must be placed so close that the space charge zone regions that are formed overlap. In this case it is also necessary to dope with the deep acceptor at the beginning and at the end of the intended insulating layer stack in order to obtain complete insulation and no conductive edge regions. Such layers are advantageous for the switching behavior of components, since the re-emission of charge carriers from deep impurities, when the applied voltage changes, is minimized due to the reduced number of deep impurities and, at the same time, low residual conductivity.

The doping according to the invention in the semiconductor layer stack can be done as doping with acceptor-like or with donor-like dopants, but also as doping with acceptor-like and donor-like dopants. It is true that implementation is possible only with acceptor-like or only with donor-like dopants and in some cases also makes sense, but theoretically a combination of one donor and one acceptor is ideal, since these better compensate for electron and hole injection, as is known from the Fe and Ti compensator in InP which are energetically very close to the middle of the energy gap and therefore, no adjustment according to the invention of the Fermi level by the combination of two dopants is necessary. If acceptors and donors are used, it is not easy to dope them in alternating layers due to the normally present background doping of electrons or holes, since deep donors do not capture or compensate for electrons and deep acceptors do not capture or compensate for any holes. For example, in the case of an n-type background doping, this can be achieved by co-doping the donor with a shallow p-dopant in a concentration above the electron concentration.

Alternatively, a donor in the upper half of the band gap and an acceptor in the lower half of the band gap can be used. In GaN, the latter enables, for example, C to be a deep acceptor in a first layer and a deep donor without p-co-doping in the upper half of the band gap in a second layer. If a space charge zone forms over the area, the slight p-type conduction induced by the acceptor is then compensated by the donor in the second layer, although both energy positions are far outside the middle area of the energy band gap. Such a structure with a deep acceptor in layer A and a deep donor in layer B can be ideally implemented. In such combinations, acceptors in the lower half of the band gap and donors in the upper half of the band gap are preferably used.

The structure or the semiconductor layer stack of the invention comprises at least two layers, that is a sequence of at least two layer packets including at least two layers (A, B) with a Fermi level position, $$E_F - E_V < \frac{E_G}{2}$$

applying as an individual layer in layer (A), and $$E_L - E_F < \frac{E_G}{2}$$

applying as an individual layer in layer (B), wherein it is advantageous to alternate these multiple times, i.e. to grow ABABAB, ABABA or BABAB, and also possible are layer sequences such as ABCBA or ACBADB, etc. having C and D arbitrary intermediate layers, which, however, may not prevent the formation of a continuous space charge zone region (110) due to their thickness and doping.

According to the invention, a component module is proposed, comprising at least one component which contains a semiconductor layer stack according to the invention.

Figure 5:
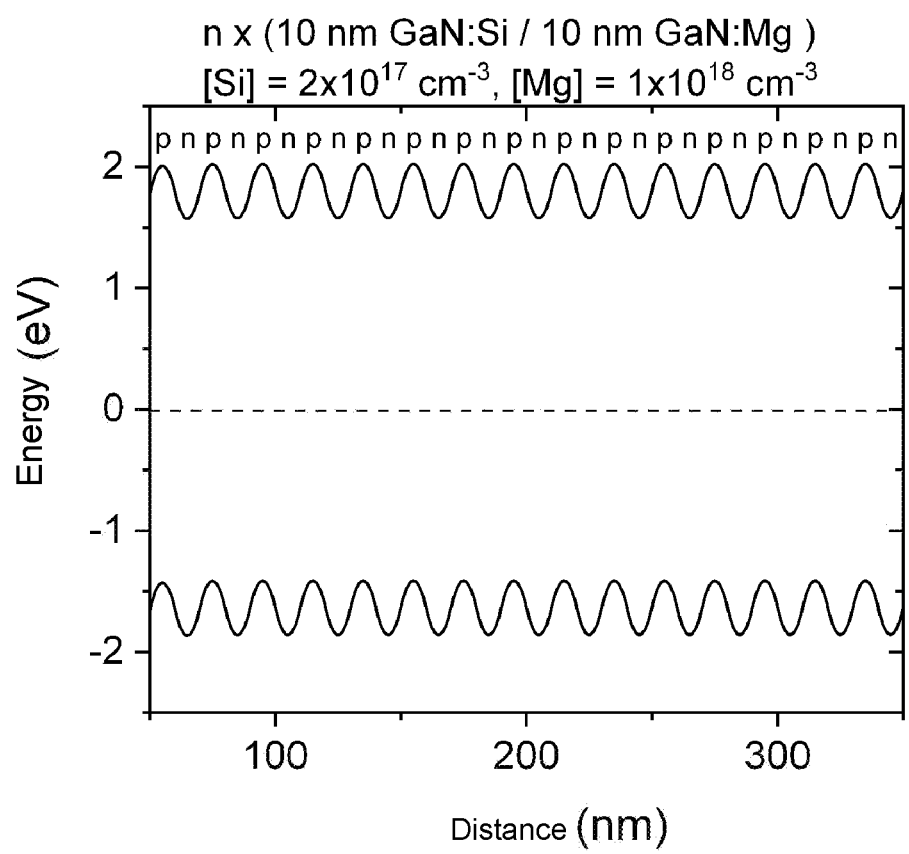

In principle, the structure according to the invention is also possible only with shallow dopants or combined with shallow and deep donors and/or acceptors. This means a deep acceptor and a shallow donor and vice versa or only a shallow donor and a shallow acceptor, as shown in FIG. 5. In this case, multiple layers are necessary for an insulating effect, since only one p-n junction, i.e. one diode structure, is created with only one pair of layers A and B. At a lower Fermi level according to the invention, a p-n structure is also generally created, but the layers are then already so highly resistive that the current flow through them is greatly reduced and the diode characteristic would be only very weak.

If shallow dopants are used, usually very thin layers are necessary to obtain a continuous space charge zone, since the carrier concentration is then usually above $10^{16}$ cm$^{-3}$; for this reason also, several layers are required in order to achieve a sufficiently high insulation effect over a sufficient layer thickness, since the breakdown field strength is limited due to the type of material.

The approach with shallow dopants is already similarly realized in semiconductor laser structures. There, the laser diode structured by etching with an exposed p-n junction with an inverted diode structure, i.e. reversed layer sequence of p- and n-conductive layer as compared to the laser diode structure, is overgrown. This creates a diode that blocks around the laser diode during laser operation in the forward direction, which limits the flow of current to the area in the laser structure. However, this is not comparable with the embodiment according to the invention for the layers mentioned here, since on the one hand a 3-dimensional structured sample is overgrown and on the other hand the layer thicknesses of the inversely grown or later operated p-n structure are usually greater than the space charge zone.

In this example, the target is not a middle position of the Fermi level, but the behavior of a diode operated in the reverse direction. The voltages that can be achieved in this way up until the breakdown would be low due to the limitation of the thickness of these blocking diode layers, but would be limited anyway in a laser structure by the current flow of the laser diode in the forward direction through the active area.

An advantageous development of the semiconductor layer stack in the material system of group III nitrides exemplified below consists in doping one of the following dopants in the first layer (A), alternating with in each case the second dopant in the second layer (B) in group III nitride semiconductors:

Iron and carbon or
Carbon and a donor or
Iron and magnesium or
Iron and zinc.

Combinations of these dopants in more than two layers or partly in one of several layers are also possible. In the case of doping with shallow donors such as Si or Ge in GaN or the acceptor Mg in GaN, it can also be advantageous in individual cases to dope them continuously at a low concentration and to only dope the compensating impurity, i.e. a deep acceptor or donor, in individual layer sections, which is covered by the claims according to the invention, since the change in position of the Fermi level in a hypothetical infinitely extended individual layer is critical to the successful implementation, which is also given in these cases.

Donors in group III nitrides can be deep, such as those that can also be achieved with C, or shallow ones, such as Si, Ge or O. However, when using shallow dopants, due to the smaller space charge zone widths, very thin layers or very low dopant concentrations are necessary in order to not produce layers with high residual conductivity, i.e. to obtain an area fully depleted of charge carriers as shown in FIG. 5, where 10 nm thin individual layers are used. The implementation of such thin layers is made more difficult by flow effects and the entrainment of some dopants such as Mg in modern growth processes such as MOVPE.

For the implementation according to the invention or a method for producing a semiconductor layer stack, at least the following steps are advantageous:

the provision of a substrate in a system for the deposition of semiconductors
the application of a sequence of at least two layers (A, B), which as individual layers each have an energy position of the Fermi level (103) in the semiconductor band gap (104, 105), $$E_F - E_V < \frac{E_G}{2}$$

applying to layer (A) and $$E_L - E_F < \frac{E_G}{2}$$

applying to layer (B)

wherein the thickness (106, 107) of the layers DA and DB (A, B) is selected such that a continuous space charge zone region (110)

$$W_A + W_B = \sqrt{\frac{2 \cdot \varepsilon_s}{q}\left(\frac{N_A + N_B}{N_A \cdot N_B}\right)\Psi_{bi}}$$

over the layers (A, B) results and $D_A \leq W_A$ and $D_B \leq W_B$ applies, with $W_A$ and $W_B$ being the space charge zone as well as $N_A$ and $N_B$ the dopant concentrations in layers A and B, $\varepsilon_S$ the dielectric constant, q the elementary charge and $\psi_{bii}$ the built-in potential difference, which is identical to the energy difference of the Fermi levels.

The choice of the maximum thickness of the layers results from a numerical estimate of the space charge zone widths that are formed, wherein it is advantageous to remain well below the calculated layer thickness, i.e. by at least a factor of two, better five and ideally over 10, since there is then a low band modulation, i.e. a very even band profile.

Below, some exemplary embodiments and a description of the figures are presented using the example of gallium nitride that has already been introduced.

Nowadays, gallium nitride is an important semiconductor for a variety of applications such as LEDs for general lighting but also for power electronics. As a thin-film material, components are usually manufactured commercially using MOVPE.

Due to intrinsic defects and impurities, GaN is usually slightly n-type conductive and rarely has a high impedance, mostly due to process-related carbon impurities. In early work, the acceptors zinc or magnesium were used, which have activation energies>150 meV in order to achieve high impedance, but with a moderate blocking behavior which is above $10^{10}$ cm$^{-3}$ at the relatively high hole concentration generated by these dopants. Iron, a frequently used compensator in III-V semiconductors, nowadays is partly used for GaN. However, the energy position of 0.6 eV below the conduction band leads to a relatively high residual electron conductivity, which is disadvantageous in most electronic components. All the more so as unipolar devices in the GaN system often conduct electrons and therefore, electron injection into the insulating layer of such a layer is only moderately well blocked. Alternatively, carbon is used. Intrinsically doped, it results in a deep acceptor in the lower half of the GaN band gap (approx. $E_V$+0.9 eV) and a donor in the upper half of the band gap. Doped with a precursor such as propane or another hydrocarbon or carbon-containing precursor such as CBr$_4$ under standard growth conditions, carbon is mainly incorporated as a deep acceptor.

No advantageous properties are reported regarding incorporating carbon as a deep acceptor and, at the same time, as a deep donor, which is not surprising, since setting a suitable acceptor/donor ratio that would ensure a Fermi level as close to the middle of the band gap as possible is not currently possible due to lack of knowledge. In principle, however, such a single dopant that generates two levels is suitable if the ratio of the two levels can be adjusted by the growth conditions. FIG. 2 and FIGS. 3, 4, and 5 show the energy positions of the bands relative to the Fermi level, which is defined here with a value of 0 eV and is represented by the dashed line.

The upper continuous curve in the respective diagram represents the conduction band, the lower one, the valence band.

Figure 2A:
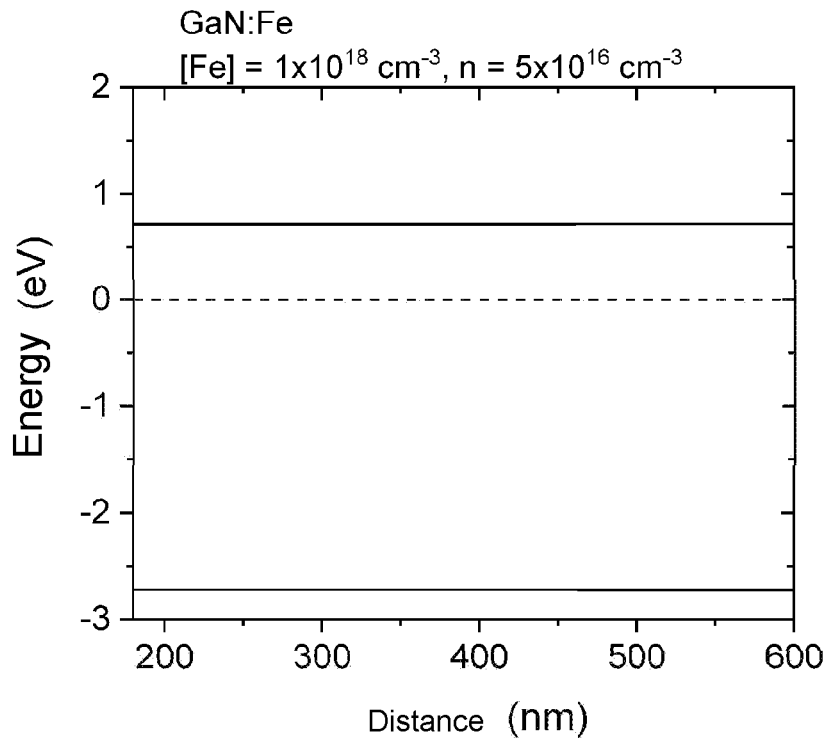
FIGS. 2*a*, 2*b*, 3, 4, and 5 show energy positions of the bands relative to the Fermi level.
Figure 2B:
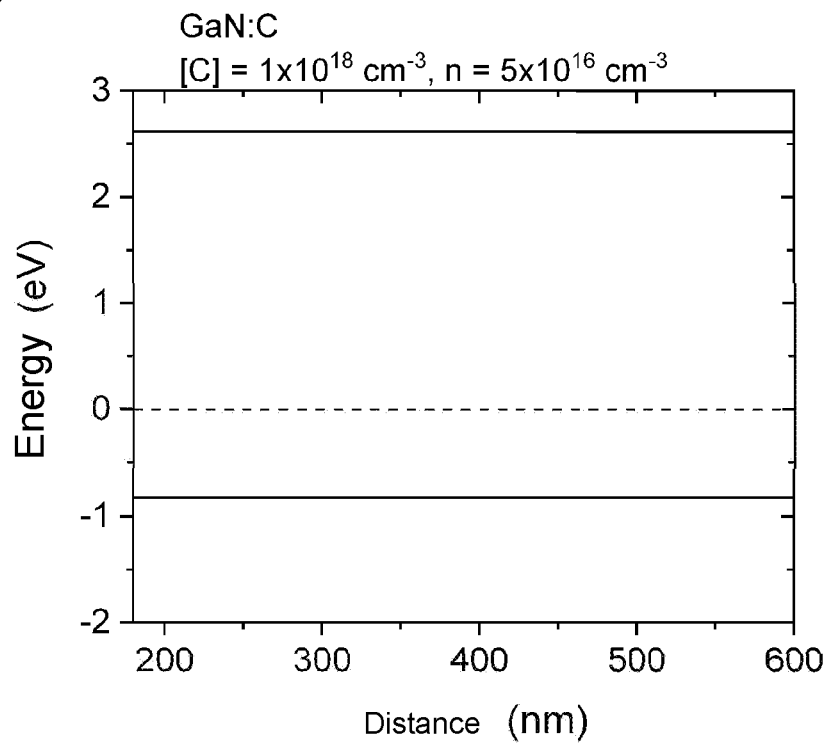
Figure 3:
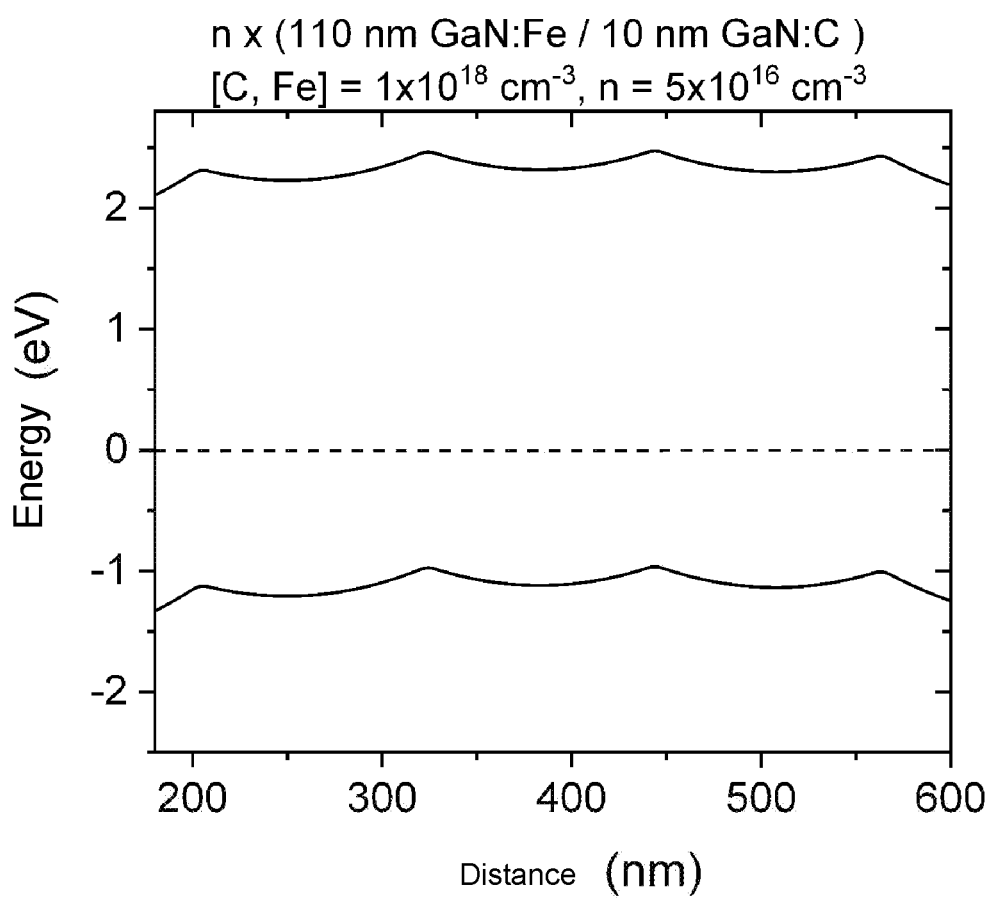

FIG. 2a) shows the position of the energy bands when doped with Fe; 2b) when doped with C. In both cases, the Fermi level is relatively close to the conduction or valence band. Therefore, the residual charge carrier concentration is still relatively high.

If the aim is to achieve a high-impedance individual layer, it is possible, for example, to co-dope an individual layer with Fe and C, wherein the ratio of the dopants must take into account the energy position.

An energy position of $E_L$–0.6 eV for Fe and $E_V$+0.9 eV results in a ratio of the concentrations of approx. 5,000. This must be met as precisely as possible, but this is also dependent on the exact, but mostly only imprecisely known, energy position in the band gap. For this reason alone it is much easier to dope the dopants in alternating layers, since then the concentration and the exact energy position of the dopants can vary more or be less precisely known. In an n-type semiconductor, the thickness of the Fe-doped layers is thicker than that of the C-doped, since the acceptors only capture electrons and the Fermi level, due to a GaN:C layer that is too thick, is roughly at the energy position of the C in a multilayer stack. Simulations result in a layer thickness of 5 to 20 times that of the GaN:C layer for the GaN:Fe layer, depending on the application. This is shown by way of example in FIG. 3. The Fermi level in this example is 100-200 meV farther away from the valence band than with a single dopant, which further lowers the concentration at the holes, thereby increasing resistivity.

Figure 4:
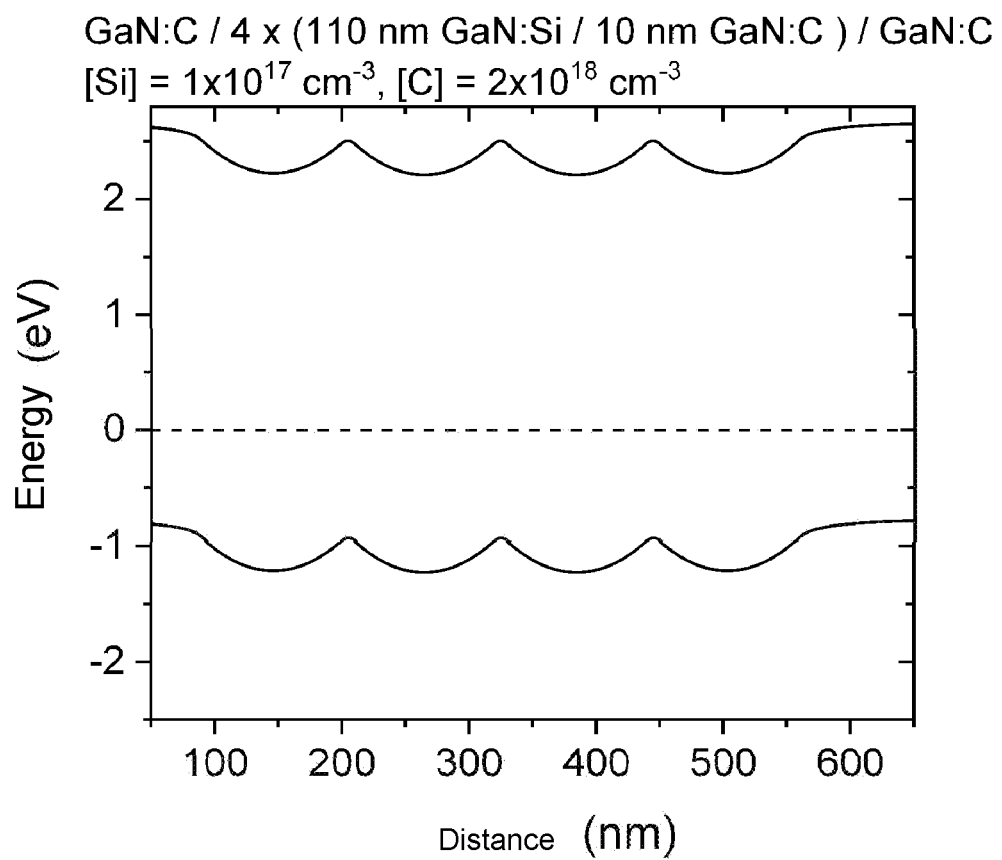

In another embodiment, the combination of the shallow donor Si and the deep acceptor C, the doping of C in concentrations of e.g. $2 \times 10^{18}$ cm$^{-3}$ is done only in thin layers if the Si concentration is continuous or present in individual layers, e.g. $1 \times 10^{17}$ cm$^{-3}$, which layers are a little thicker than is mathematically necessary to capture all the free electrons generated by Si, i.e. to take up a little more than 1/10 of the volume in this example. This is shown in FIG. 4 for a short stacking sequence. If the C-doped layers are too thick, the Fermi level again lies near the C-type impurity and there is a slight p-type conductivity. If the same is to be accomplished with Mg and Fe, a sufficient n-type background must be present, whether intrinsic or e.g. through continuous doping, in order to successfully combine them, similar to the combination of C and Fe. However, Mg concentrations that are too high or a GaN:Mg layer that is too thick would lead to a noticeable p-type conduction.

In such a case, a deep donor in the upper half of the band gap in combination with or alternating with Mg is more suitable. Ti or the deep C donor could be used here, provided that these can be specifically incorporated. In principle, it is also easily possible to n- and p-dope with shallow impurities in alternation, so that the complete depletion according to the invention takes place via these layers. FIG. 5 shows this for thin alternating layers; here, the Fermi level is on average almost perfectly in the middle of the energy gap.

Combinations of deep and shallow impurities or only shallow ones are interesting insofar as e.g. Si and Mg are mostly available at group III nitride layer deposition systems, and thus at most one deep dopant, instead of two, must be stored. Easier to handle, however, are processes with dopants whose energy levels are so low that they basically deplete the material, i.e. the charge carrier concentration, when using the same, is below $10^{14}$ cm$^{-3}$. At charge carrier concentrations below $10^{14}$ cm$^{-3}$, the space charge zone width is>1 µm. If dopants such as C or Fe are used in a concentration above the electron concentration in the undoped case, the charge carrier concentration in the GaN normally lies below $10^{10}$ cm$^{-3}$, which entails a space charge zone>100 µm. Therefore, there is only slight band bending between the alternatingly doped layers, mostly present towards the more strongly conductive layers lying below and above, if applicable.

FIG. 1a shows a schematic view of an energy-location-diagram of how, starting from an alternating layer structure with the differently doped layers A and B which are here not yet in electrical contact, said layers line up along the electrochemical potential or the Fermi level. Here, 101 is the conduction band $E_C$, 102 the valence band $E_L$, 103 the Fermi level $E_{Dopant, Fermi}$, which in FIG. 1a should be identical to the energy position of the dopants, provided that the concentration of each of the dopants is so high that the Fermi level is pinned to the energy position of the latter, which is not absolutely necessary for an embodiment according to the invention. This means that even only partial compensation of the background charge carriers and thus a position of the Fermi level that is not identical to the energy position of the dopant can lead to the desired result but is more difficult to implement in a reproducible manner. The thickness of the layers A and B is indicated by 106 and 107 and the respective band gap energy by 104 and 105, which are identical in homoepitaxy but can in principle also differ. If these layers A and B are brought into electrical contact, a potential difference arises which is compensated for by the charge shift and the resulting band bending. FIG. 1b shows this for the case of very thick individual layers, which are so thick that the resultant space charge zones (109) are thinner than half the thickness of the layer pair. In this case, individual space charge zones are created between the differently doped regions, the first three shaded exemplary areas of which are marked with 109. However, the space charge zones do not extend into the adjacent transition; instead, the bands 101 and 102 are shallow outside the space charge region and the Fermi level 108 is pinned at the impurity level. Only within the space charge zone is it located energetically between the two impurity levels. If the layer thickness decreases, then a region completely traversed with space charge zones or a continuous space charge region (110) results, i.e. an electric field modulated by means of the individual layers as shown in FIG. 1c is present over the entire structure, which in FIG. 1d, for even thinner layers, ends in an ever shallower band profile in which the Fermi level 108 assumes an energy position between that of the impurity levels. For reasons of clarity, the decrease in the layer thickness is not graphically displayed or the horizontal axis of the distance is shown on a different scale than in FIG. 1b. Since the charges that are moved here by the potential differences, i.e. the fixed charges of ionized impurities are now only present in a low concentration, the band bending extends over a large area and on average leads to a nearly shallow band profile. In an actual structure, additional band bending results starting from the surface or the doped layers at the edges of the alternating layer structure, which is not taken into account here and usually overlays the entire structure.

By way of example, FIG. 6 shows the comparison of current-voltage characteristic curves a) and the resistivity b) calculated therefrom between an upper metal contact and the conductive substrate of differently doped buffer layers of a GaN based field effect transistor structure on silicon (111). The sample with an Fe-doped GaN buffer shows the highest current, followed by the C-doped buffer, as is expected from the position of the dopants (Fe≈$E_L$−0.6 eV; C≈$E_C$+0.9 eV). If the above doping is used and a sample with an approx. 3 µm thick buffer made of alternately 200 nm thick Fe and C-doped GaN layers is prepared, the current is lower, although Fe-doped or C-doped layers alone have a higher current, i.e. the specific resistivity of the individual layers is lower. In the combination according to the invention of alternately successive Fe- and C-doped individual layers, however, they have the lowest current and highest impedance.

In such structures on silicon, Al-containing intermediate layers are introduced into the GaN in order to avoid thermal cracks. Due to the charges that arise at the boundary layers, it is advantageous to dope the GaN with Fe after the Al-containing intermediate layer and before the one with C, since, seen in the direction of growth, there is a potential for an accumulation of holes above the intermediate layer and below the electrons, which can be ideally compensated in this way.

The application according to the invention can be checked most easily, e.g., with methods of mass spectroscopy such as secondary ion mass spectroscopy (SIMS) or on the basis of the defect luminescence in high-resolution processes such as cathodoluminescence in a scanning electron microscope or a scanning transmission electron microscope. Also, dopants and their place of installation can in part be identified with high spatial resolution Raman spectroscopy.

The invention relates to all semiconductors and dopants. In particular, for some semiconductors with a narrow band gap, due to a compensator, the values for the aspired charge carrier concentration are higher than is described here for GaN with $E_G$≈3.4 eV because these semiconductors have higher charge carrier concentrations and intrinsic conductivities. Like other values, they must be adapted in accordance with the band gap energy and the density of states and the resulting intrinsic charge carrier concentrations in order to be able to achieve an inventive effect. Also, in principle it is possible to use more than two dopants and to use them in more than two alternating layers and as part of an inventive embodiment. The frequently present intrinsic conduction n or p»$n_i$ can also be used in a layer instead of using a dopant in a layer. A doped layer can also overlap into another, i.e. the doping does not have to end abruptly at the nominal end of the layer and an overlap can also be advantageous, depending on the type and energy position of the dopants. Also, the order of the layers A and B specified in the claims is exchangeable and further layers therebetween are possible as long as the condition of a continuous space charge zone region is satisfied. The description of the position of the Fermi level always refers to the case without external voltage applied to the layers.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semiconductor layer stack comprising:
   a succession of at least two layer packets, comprising at least a layer A and a layer B, which, as individual layers, each having an energy position of the Fermi level in the semiconductor band gap of applying to the layer A and applying to the layer B, with EF being the energy position of the Fermi level, EV the energy position of a valence band, EL the energy position of a conduction band and EL−EV the energy difference of the semiconductor band gap,
   wherein a thickness of the layers A and B is selected such that a continuous space charge zone region over the layers A and B results, wherein the layer A comprises a deep acceptor,
wherein the layer B comprises a shallow donor, and
wherein a concentration of the acceptor is greater than a concentration of the donor and a highly-doped layer having a deep acceptor is arranged in each case at the end of the semiconductor stack or the two layers A and B comprise a deep donor and a shallow acceptor or only a shallow donor and a shallow acceptor or a deep donor and a deep acceptor.

2. The semiconductor layer stack according to claim 1, further comprising an extrinsic or intrinsic doping resulting in at least two impurity levels, each having an energy position, applying to a layer A as an infinitely thick individual layer and applying to the layer B as an infinitely thick individual layer, in a concentration that on such infinitely thick individual layers, the Fermi level occupies the same energy position with a tolerance of ±50 meV as the impurity levels, wherein the thicknesses of the layers in the semiconductor layer stack are selected such that a continuous space charge zone region forms over the overall layer stack.

3. The semiconductor layer stack according to claim 1, further comprising an energy position of the deep impurity levels produced by the doping, applying to the layer A and applying to the layer B.

4. The semiconductor layer stack according to claim 1, further comprising an average Fermi energy position EF in an energy range in the space charge zone region.

5. The semiconductor layer stack according to claim 1, further comprising a doping with acceptor-like or donor-like dopants.

6. The semiconductor layer stack according to claim 1, further comprising a doping with acceptor-like and donor-like dopants.

7. The semiconductor layer stack according to claim 1, further comprising, one of the following dopants in the first layer A, alternating with a respective second dopant in the second layer B in group III-nitride semiconductors:
   iron and carbon; or
   carbon and a donor; or
   iron and magnesium; or
   iron and zinc.

8. The semiconductor layer stack according to claim 1, further comprising:
   an energy position, which, due to the deep impurity levels for which applies to the layer A and applies to the layer B, is an average Fermi energy position in a range below or above the average range of the bandgap energy, so that the average range amounts to a total of 40% of the bandgap energy or the range amounts up to 20% of the bandgap energy.

9. The semiconductor layer stack according to claim 1, wherein the layer A and the layer B are made in the material system of the group III-nitrides.

10. The semiconductor layer stack according to claim 1, wherein the layer A and the layer B are made in GaN.

11. The semiconductor layer stack according to claim 10, wherein GaN is doped with Si or Ge being shallow donors.

12. The semiconductor layer stack according to claim 1, wherein the concentration of the shallow donors is between $10^{16}$-$10^{17}$ cm$^{-3}$.

13. A component module, comprising at least one component containing a semiconductor layer stack according to claim 1.

14. A semiconductor layer stack comprising:
   a succession of at least two layer packets, comprising a layer A and a layer B, which, as individual layers, each has an energy position of the Fermi level in the semiconductor band gap of applying to the layer A and applying to the layer B, with EF being the energy position of the Fermi level, EV the energy position of a valence band, EL the energy position of a conduction band and EL−EV the energy difference of the semiconductor band gap; and
   a highly-doped layer having a deep acceptor is arranged at an end of the semiconductor stack,
   wherein a thickness of the layers A and B is selected such that a continuous space charge zone region over the layers A and B results,
   wherein the layer A comprises a deep acceptor,
   wherein the layer B comprises a shallow donor, and
   wherein a concentration of the acceptor is greater than a concentration of the donor.

15. A semiconductor layer stack comprising:
   a succession of at least two layer packets, comprising at least a layer A and a layer B, which, as individual layers, each having an energy position of the Fermi level in the semiconductor band gap of applying to the layer A and applying to the layer B, with EF being the energy position of the Fermi level, EV the energy position of a valence band, EL the energy position of a conduction band and EL−EV the energy difference of the semiconductor band gap,
   wherein a thickness of the layers A and B is selected such that a continuous space charge zone region over the layers A and B results,
   wherein the layer A comprises a deep acceptor, and
   wherein the layer B comprises a shallow donor.

\* \* \* \* \*